(12) United States Patent
Hung et al.

(10) Patent No.: US 6,875,660 B2
(45) Date of Patent: Apr. 5, 2005

(54) METHOD OF MANUFACTURING HIGH COUPLING RATIO FLASH MEMORY HAVING SIDEWALL SPACER FLOATING GATE ELECTRODE

(75) Inventors: Chih-Wei Hung, Hsin-chu (TW); Cheng-Yuan Hsu, Hsinchu (TW); Da Sung, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 92 days.

(21) Appl. No.: 10/248,867

(22) Filed: Feb. 26, 2003

(65) Prior Publication Data

US 2004/0166641 A1 Aug. 26, 2004

(51) Int. Cl.⁷ .............................................. H01L 21/336
(52) U.S. Cl. ....................... 438/279; 438/257; 438/267; 438/262; 438/279; 438/283; 438/595; 438/596
(58) Field of Search ................................ 438/257, 267, 438/279, 767, 315, 262, 264, 265, 283, 299, 593, 594, 595, 596

(56) References Cited

U.S. PATENT DOCUMENTS

| | | | | | |
|---|---|---|---|---|---|
| 5,494,838 A | * | 2/1996 | Chang et al. | ................ | 438/264 |
| 6,117,733 A | * | 9/2000 | Sung et al. | ................ | 438/265 |
| 6,245,614 B1 | | 6/2001 | Hsieh et al. | ................ | 438/267 |
| 6,436,764 B1 | * | 8/2002 | Hsieh | ................ | 438/257 |
| 6,462,375 B1 | * | 10/2002 | Wu | ................ | 257/316 |
| 6,563,166 B1 | * | 5/2003 | Ni | ................ | 257/316 |
| 2003/0181051 A1 | * | 9/2003 | Chang et al. | ................ | 438/694 |

FOREIGN PATENT DOCUMENTS

CN 451480 8/2001

* cited by examiner

Primary Examiner—Amir Zarabian
Assistant Examiner—Khanh Duong
(74) Attorney, Agent, or Firm—Liang Chyun IP Office

(57) ABSTRACT

A method of manufacturing a flash memory is provided. First, a substrate with a first gate structure and a second gate structure thereon is provided. The first gate structure and the second gate structure each comprises of a dielectric layer, a first conductive layer and a cap layer. A tunneling oxide layer is formed over the substrate and then a first spacer is formed on the sidewall of the first conductive layer. Thereafter, a second conductive layer is formed on one side designated for forming a source region of the sidewalls of the first gate structure and the second gate structure. Then, the source region is formed in the substrate in the designated area. Next, an inter-gate dielectric layer is formed over the second conductive layer and then an insulating layer is formed over the source region. After forming a third conductive layer over the area between the first gate structure and the second gate structure, a drain region is formed in the substrate.

20 Claims, 6 Drawing Sheets

METHOD OF MANUFACTURING HIGH COUPLING RATIO FLASH MEMORY HAVING SIDEWALL SPACER FLOATING GATE ELECTRODE

BACKGROUND OF THE INVENTION

1. Field of Invention

The present invention relates to a semiconductor manufacturing method. More particularly, the present invention relates to a method of manufacturing a flash memory.

2. Description of Related Art

Flash memory is a type of device that permits multiple accesses, read-outs and erases. Furthermore, data stored within the device is retained even after power to the device is cut off. With such big advantages, flash memory is one of the most useful non-volatile memories in personal computers and electronic equipment.

A typical flash memory device has doped polysilicon floating gate and control gate. The floating gate and the control gate inside the device are isolated from each other by a dielectric layer. To write/erase data into a flash memory, a bias voltage is applied to the control gate and the source/drain region and hence electrons are injected into the floating gate or pulled out of the floating gate. To read data from the flash memory, an operating voltage is applied to the control gate. Since the charging state of the floating gate directly affects the conduction of the channel underneath, a data value of "1" or "0" can be determined.

To erase data from the flash memory, relative potential of the substrate, the drain (source) region or the control gate is raised so that tunneling effect sets in to force the trapped electrons within the floating gate into the substrate or drain (source) terminal through the tunneling oxide layer (that is, carrying out a substrate erase or drain (source) side erase). Alternatively, the electrons trapped within the floating gate pass through the dielectric layer and transfer to the control gate. Since the quantity of electrons bled out from the floating gate when erasing data from the flash memory is difficult to control, an excessive amount of electrons may flow out from the floating gate resulting in a net positive charge. This condition is called over-erase. When over-erase is excessive, the channel underneath the floating gate may conduct before the application of an operating voltage to the control gate and hence ultimately lead to a data read-out error. To minimize data errors due to an over-erased floating gate, a high-density flash memory with a three-layered gate is developed.

FIGS. 1A to 1C are schematic cross-sectional views showing the steps for producing a conventional flash memory. As shown in FIG. 1A, an insulating layer (not shown) and a conductive layer (not shown) is formed over a substrate 100. The conductive layer and the insulating layer are patterned to form a dielectric layer 102 and a select gate 104. Thereafter, a tunneling oxide layer 106 is formed over the substrate 100 and an inter-gate dielectric layer 108 is formed over the select gate 104.

As shown in FIG. 1B, a conductive layer or a doped polysilicon layer is formed over the substrate 100. The conductive layer 110 is patterned to form a plurality of longitudinal strips such that a portion of the conductive layer 110 lies above the select gate 104. Another inter-gate dielectric layer 112 is formed over the conductive layer 110. Thereafter, another conductive layer 114 or doped polysilicon layer is formed over the inter-gate dielectric layer 112.

As shown in FIG. 1C, the conductive layer 114, the inter-gate dielectric layer 112, the conductive layer 110 and the tunneling oxide layer 106 are patterned to form a control gate 114a, an inter-gate dielectric layer 112a, a floating gate 110a and a tunneling oxide layer 106a. The select gate 104, the floating gate 110a and the control gate 114a together constitute a gate structure. Thereafter, a source region 116 and a drain region 118 are formed in the substrate 100 on each side of the gate structure.

In the process of forming the control gate 114a, the channel regions 120a, 120b underneath the floating gate 110a is difficult to define due to possible mask misalignment between the floating gate 110a and the select gate 104. In other words, if the patterned floating gate 110a is misaligned length between the channel region 120a and the channel region 120b will never be identical. Because channel length of two neighboring memory cells using the same common source region are non-identical, memory cell programming will be non-symmetrical. Ultimately, operating speed of the memory cells will have to slow down.

SUMMARY OF THE INVENTION

Accordingly, one object of the present invention is to provide a method of manufacturing a flash memory. A self-aligned process is utilized to fabricate a floating gate so that a slow down of the operating speed resulting from a non-symmetrical programming of memory cell in the presence of channels with unequal lengths are prevented. Hence, overall performance of the memory cells is improved.

A second object of this invention is to provide a method of manufacturing a flash memory that utilizes a self-aligned process to from an L-shaped floating gate. The L-shaped floating gate configuration not only prevents problems caused by unequal channel lengths, but also increases the overlapping area between the floating gate and the control gate, thereby improving overall performance of the device.

To achieve these and other advantages and in accordance with the purpose of the invention, as embodied and broadly described herein, the invention provides a method of manufacturing a flash memory. A substrate having a first gate structure and a second gate structure thereon is provided. The first gate structure and the second gate structure each comprises of a dielectric layer, a first conductive layer and a cap layer. A tunneling oxide layer is formed over the substrate and then a first spacer is formed on the sidewall of the first conductive layer. Thereafter, a second conductive layer is formed on one side designated for forming a source region of the sidewalls of the first gate structure and the second gate structure. A source region is formed in the substrate in the designated area. Next, an inter-gate dielectric layer is formed over the second conductive layer and then an insulating layer is formed over the source region. After forming a third conductive layer over the area between the first gate structure and the second gate structure, a drain region is formed in the substrate.

The first conductive layer serves as a select gate, the second conductive layer serves as a floating gate and the third conductive layer serves as a control gate in the flash memory. The inter-gate dielectric layer is a composite layer such as an oxide/nitride/oxide layer.

In this invention, the second conductive layer is formed in several steps. First, conductive material is deposited over the substrate to form a conductive material layer. Designated source region is then covered with a patterned photoresist layer. Using the patterned photoresist layer as a mask, the conductive material layer that is not covered by the patterned photoresist layer is removed. After removing the photoresist layer, an anisotropic etching process is performed to remove the conductive material layer and form the second conductive layer. Because the floating gate (the second conductive layer) is formed in a self-aligned process, the channel regions of neighboring memory cells has equal length. Since channel length of two neighboring memory cells using the same source region is identical, non-symmetrical memory cell programming is prevented and reliability of the memory is improved.

This invention also provides an alternative method of manufacturing a flash memory. A substrate having a first gate structure and a second gate structure thereon is provided. The first gate structure and the second gate structure each comprises of a dielectric layer, a first conductive layer and a cap layer. A tunneling oxide layer is formed over the substrate and then a first spacer is formed on the sidewall of the first conductive layer. Thereafter, a first conductive material layer and a material layer are sequentially formed over the substrate. A first patterned photoresist layer is formed over the material layer. The first patterned photoresist layer covers the area designated for forming the source region. Using the first patterned photoresist layer as a mask, the material layer and the first conductive layer that are not covered by the first patterned photoresist layer are removed. After removing the first patterned photoresist layer, an anisotropic etching process is carried out to remove a portion of the material layer and the first conductive material layer and form a second spacer and a second conductive layer. The second spacer is removed and then a source region is formed in the substrate. An inter-gate dielectric layer is formed over the second conductive layer and an insulating layer is formed over the source region. A third conductive layer is formed in the area between the first gate structure and the second gate structure. Finally, a drain region is formed in the substrate.

The first conductive layer serves as a select gate, the second conductive layer serves as a floating gate and the third conductive layer serves as a control gate in the flash memory. The inter-gate dielectric layer is a composite layer such as an oxide/nitride/oxide layer.

In this invention, the second conductive layer is formed in several steps. First, a conductive material layer and a material layer are sequentially formed over the substrate. Designated source region is then covered with a patterned photoresist layer. Using the patterned photoresist layer as a mask, the material layer and conductive material layer that are not covered by the patterned photoresist layer are removed. Thereafter, the photoresist layer is removed. An anisotropic etching process is performed to remove a portion of the material layer and the conductive material layer, thereby forming the second spacer and the second conductive layer. The second spacer is removed so that the second conductive layer has an L-shaped profile. Because the floating gate (the second conductive layer) is formed in a self-aligned process, the channel regions of neighboring memory cells has equal length. Since channel length of two neighboring memory cells using the same source region is identical, non-symmetrical memory cell programming is prevented and reliability of the memory is improved. Furthermore, because the floating gate (the second conductive layer) has an L-shaped profile, overlapping area between the floating gate (the second conductive layer) and the control gate (the third conductive layer) is increased. Since gate coupling ratio of the device increases with overlapping area, overall performance of the device will improve.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
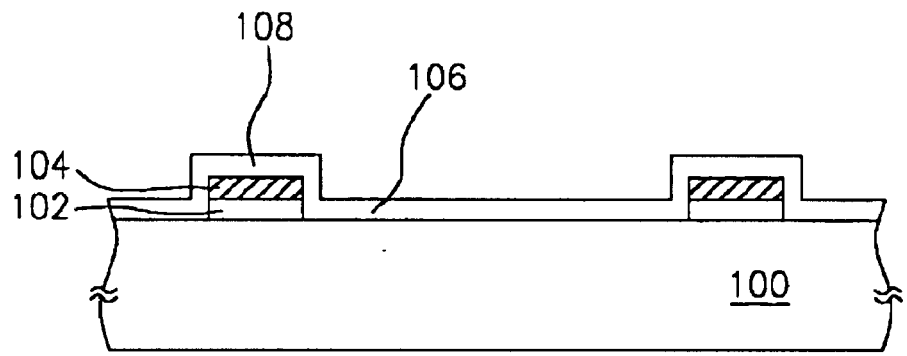
FIGS. 1A to 1C are schematic cross-sectional views showing the steps for producing a conventional flash memory.
Figure 1B:
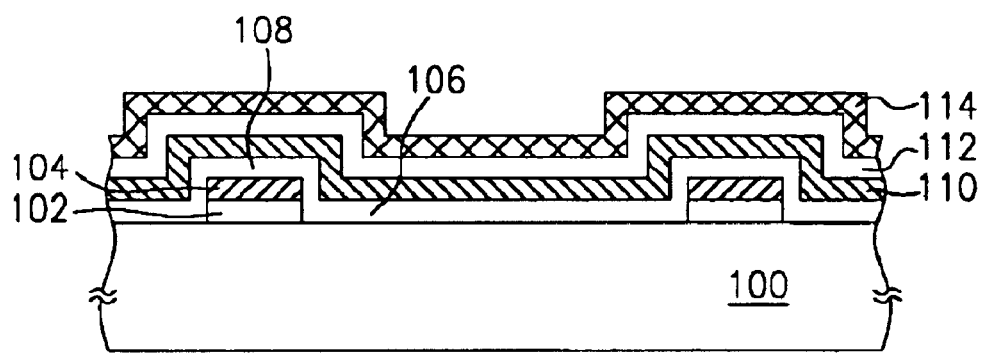
Figure 1C:
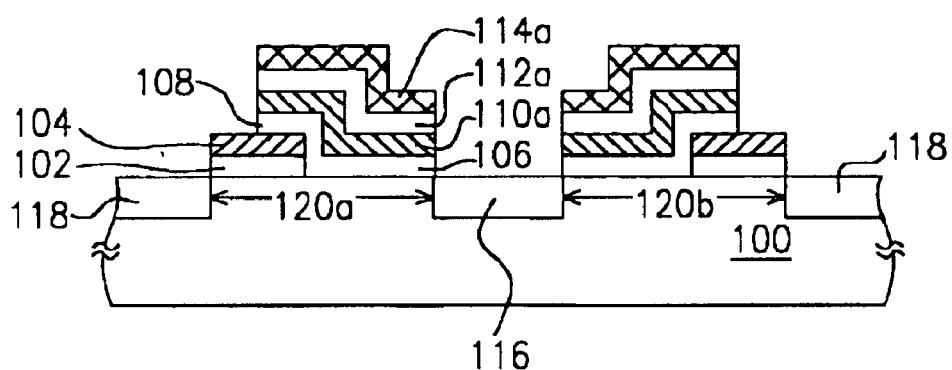

Reference will now be made in detail to the present preferred embodiments of the invention, examples of which are illustrated in the accompanying drawings. Wherever possible, the same reference numbers are used in the drawings and the description to refer to the same or like parts.

Figure 2A:
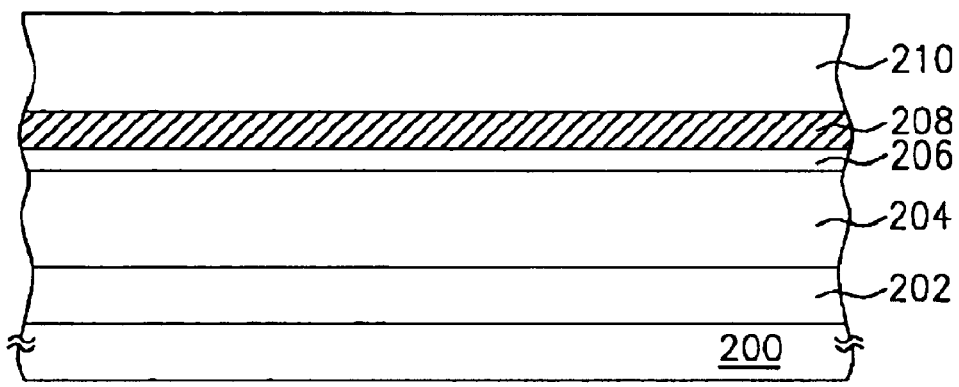
FIGS. 2A to 2F are schematic cross-sectional views showing the steps for producing a flash memory according to a first preferred embodiment of this invention.

FIGS. 2A to 2F are schematic cross-sectional views showing the steps for producing a flash memory according to a first preferred embodiment of this invention. As shown in FIG. 2A, a substrate 200 such as a P-type silicon substrate is provided. The substrate 200 has a deep N-well region 202 and a P-well region 204 above the deep N-well region 202. Thereafter, a dielectric layer 206, a conductive layer 208 and a cap layer 210 are sequentially formed over the substrate 200. The dielectric layer 206 having a thickness between 90 Å to 100 Å is formed, for example, by performing a thermal oxidation. The conductive layer 208 is fabricated using a material such as doped polysilicon. The conductive layer 208 is formed, for example, by performing a chemical vapor deposition to form an undoped polysilicon layer and then implanting ions into the polysilicon layer. The cap layer 210 having a thickness between 1000 Å to 2000 Å can be a silicon nitride layer, for example. The cap layer 210 is formed, for example, by performing a low-pressure chemical vapor deposition. Alternatively, the cap layer can be a silicon oxide layer formed, for example, by performing a chemical vapor deposition using tetra-ethyl-ortho-silicate (TEOS)/ozone ($O_3$) as gaseous reactants.

Figure 2B:
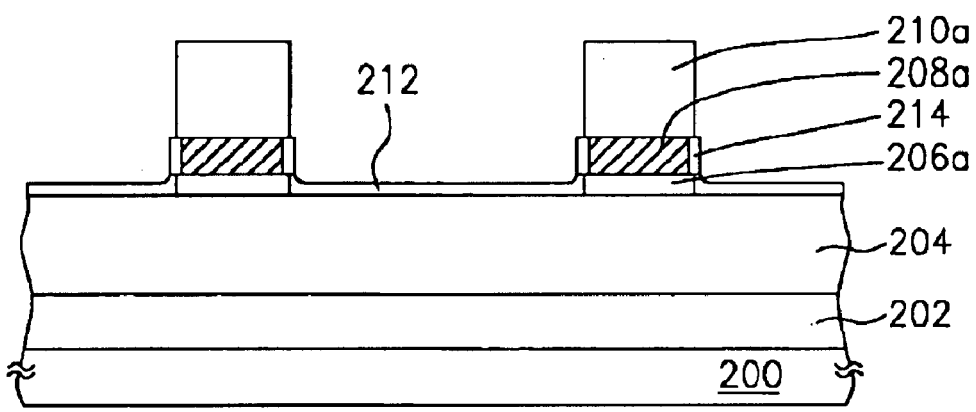

As shown in FIG. 2B, the cap layer 210, the conductive layer 208 and the dielectric layer 206 are patterned to form a cap layer 210a, a conductive layer 208a and a dielectric layer 206a. The cap layer 210a, the conductive layer 208a and the dielectric layer 206a together form a gate structure. The conductive layer 208a serves as a select gate in the flash memory. A tunneling oxide layer 212 is formed over the substrate and then spacers 214 are formed on the sidewalls of the conductive layer 208a. The tunneling oxide layer 212 and the spacers 214 are formed, for example, by performing thermal oxidation.

Figure 2C:
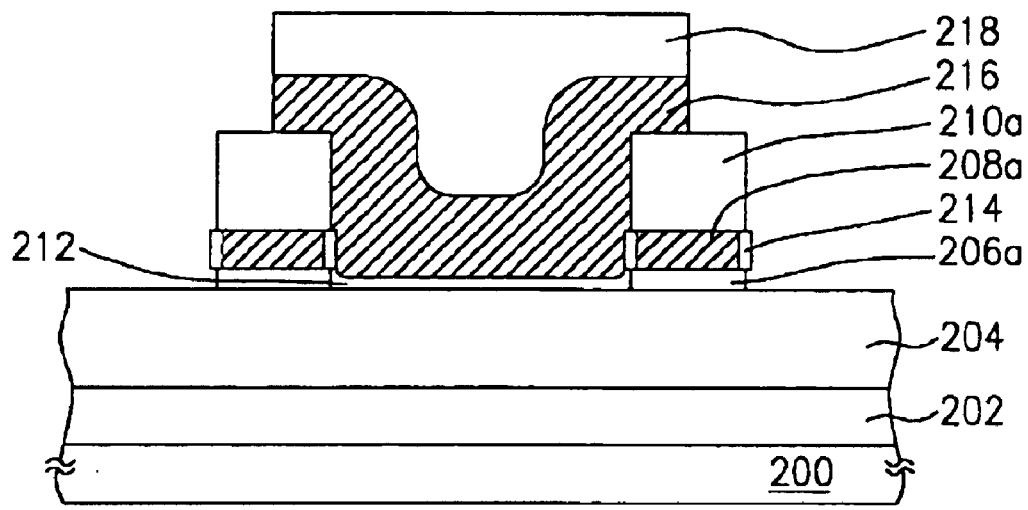

As shown in FIG. 2C, a conductive layer 216 is formed over the substrate. The conductive layer 216 is a doped polysilicon layer formed, for example, by performing a chemical vapor deposition to form an undoped polysilicon layer and then implanting ions into the polysilicon layer. A patterned photoresist layer 218 is formed over the conductive layer 216. The patterned photoresist layer 218 covers designated area for forming the source region. Thereafter, using the patterned photoresist layer 218 as a mask, the conductive layer 216 that is not covered by the patterned photoresist layer 218 is removed, for example, by performing a wet etching or dry etching process.

Figure 2D:
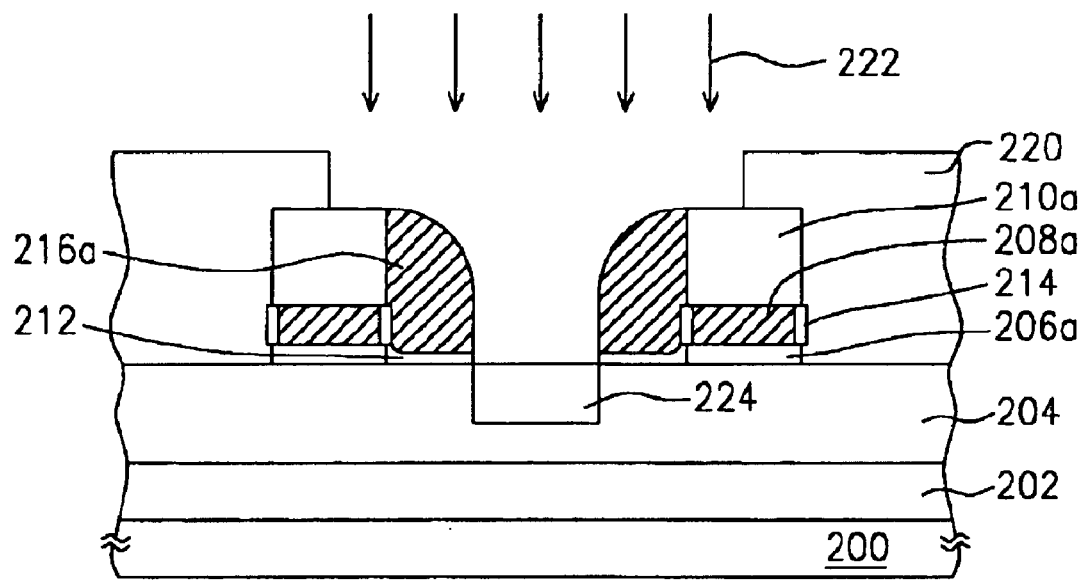

As shown in FIG. 2D, the patterned photoresist layer 218 is removed. An anisotropic etching process is carried out so that a conductive layer 216a (spacer) is formed on one side of the cap layer 210a and the conductive layer 208a. The conductive layer 216a serves as a floating gate in the flash memory. Thereafter, another patterned photoresist layer 220 is formed over the substrate 200. The patterned photoresist layer 220 exposes the designated area for forming the source region. Using the patterned photoresist layer 220 as a mask, an implantation 222 is carried out implanting dopants into the P-well region 204 between two neighboring conductive layers 216a to form a source region 224. N-type dopants such as phosphorus ions or arsenic ions are used in the implantation 222.

Figure 2E:
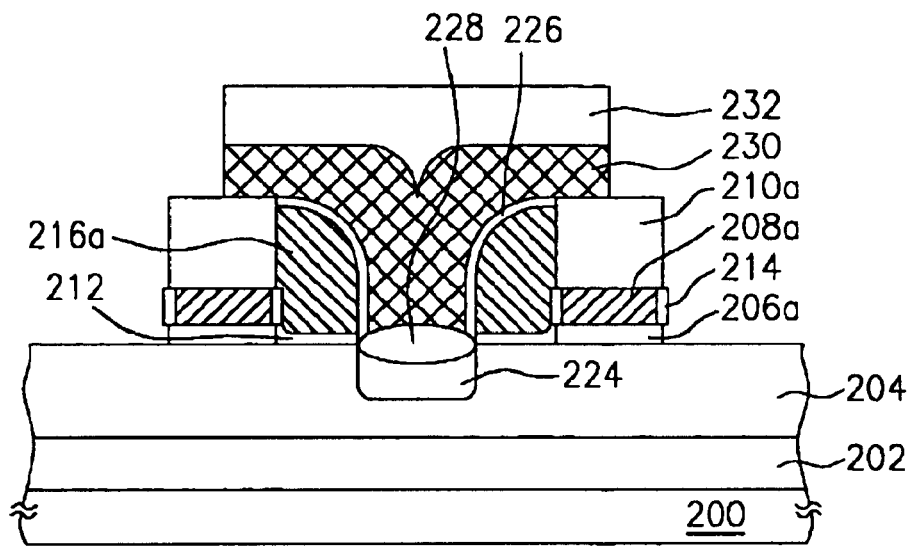

As shown in FIG. 2E, the photoresist layer 220 is removed. An inter-gate dielectric layer 226 is formed over the conductive layer 216a and then an insulating layer 228 is formed over the source region 224. The inter-gate dielectric layer 226 can be a composite layer such as an oxide/nitride/oxide layer having thickness of 70 Å/70 Å/60 Å respectively. The inter-gate dielectric layer 226 is formed, for example, by performing a thermal oxidation to form a silicon oxide layer and then performing a chemical vapor deposition to form a silicon nitride layer and another silicon oxide layer sequentially over the first oxide layer. The insulating layer 228 is a silicon oxide layer formed, for example, by performing a thermal oxidation. The insulating layer 228 and the inter-gate dielectric layer 226 are formed in the same processing step. Thereafter, another conductive layer 230 is formed over the substrate 200. The conductive layer 230 can be a doped polysilicon layer formed, for example, by performing a chemical vapor deposition to form an undoped polysilicon and then implanting ions into the polysilicon layer. A patterned photoresist layer 232 is formed over the conductive layer 230. The patterned photoresist layer 232 has a longitudinal strip configuration for patterning out the control gates of the flash memory. Using the patterned photoresist layer 232 as a mask, the conductive layer 230 that is not covered by the patterned photoresist layer 232 is removed, for example, by performing a wet etching or a dry etching process. The patterned conductive layer 230 serves as a control gate in the flash memory.

Figure 2F:
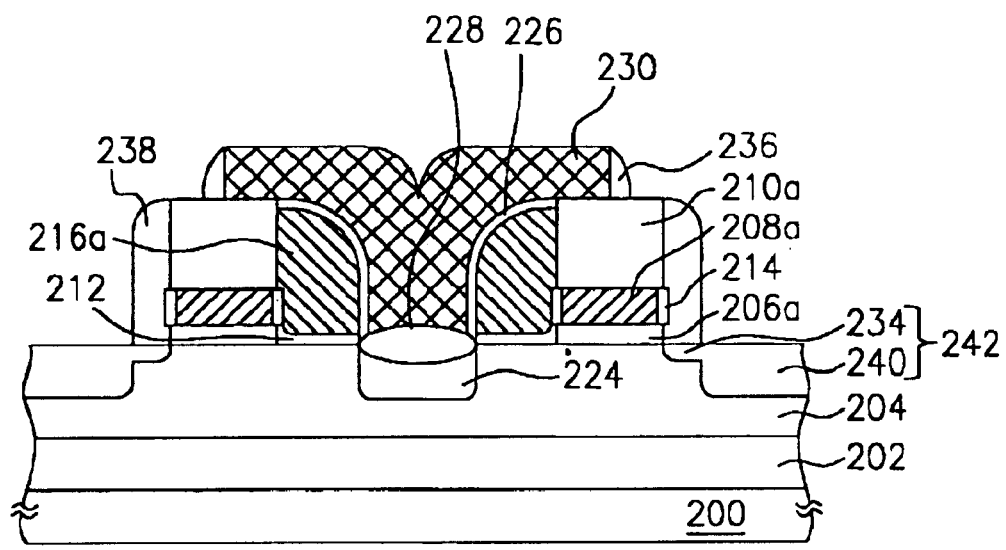

As shown in FIG. 2F, the patterned photoresist layer 232 is removed. An ion implantation is carried out to form a lightly doped region 234 in the substrate 200 on one side of the conductive layer 208a. Thereafter, spacers 236 are formed on the sidewalls of the conductive layer 230 and spacers 238 are formed on the sidewalls of the cap layer 210a, the conductive layer 208a and the dielectric layer 206a. The spacers 236 and 238 are formed, for example, by depositing insulating material over the substrate 200 to form an insulating layer and then performing an anisotropic etching process to remove a portion of the insulating layer. Another ion implantation is carried out to form a heavily doped region 240 in the substrate 200 on one side of the spacers 238. The lightly doped region 234 and corresponding heavily doped region 240 constitute the drain region 242 of the flash memory. Finally, other steps necessary for completing flash memory fabrication are performed. Since conventional steps are used, detail description is omitted.

In the first embodiment of this invention, the floating gate (the conductive layer 216a) is formed in a self-aligned process and hence the channel of two neighboring memory cell has equal length. Since channel length of two neighboring memory cells using the same source region is identical, non-symmetrical memory cell programming is prevented and reliability of the memory is improved.

Figure 3A:
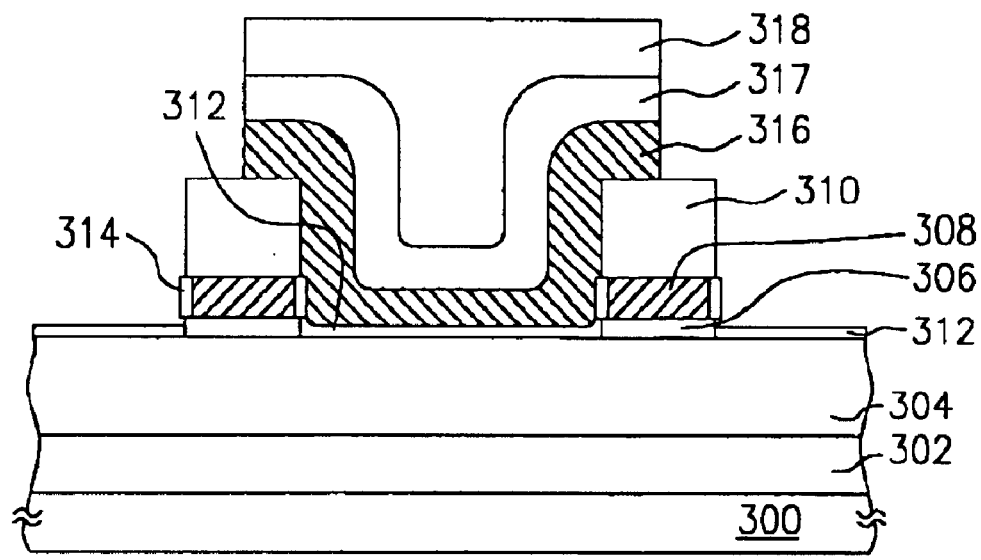
FIGS. 3A to 3D are schematic cross-sectional views showing the steps for producing a flash memory according to a second preferred embodiment of this invention.

FIGS. 3A to 3D are schematic cross-sectional views showing the steps for producing a flash memory according to a second preferred embodiment of this invention. As shown in FIG. 3A, a substrate 300 such as a P-type silicon substrate is provided. The substrate 300 has a deep N-well region 302 and a P-well region 304 above the deep N-well region 302. Thereafter, according to FIGS. 2A and 2B, a dielectric layer 306, a conductive layer 308 and a cap layer 310, a tunneling oxide layer 312 and spacers 314 are sequentially formed over the substrate 300. The cap layer 310, the conductive layer 308 and the dielectric layer 306 together form a gate structure. The conductive layer 308 serves as a select gate in the flash memory. Another conductive layer 316 is formed over the substrate 300. The conductive layer 316 is fabricated using a material such as doped polysilicon. The conductive layer 316 is formed, for example, by performing a chemical vapor deposition to form an undoped polysilicon layer and then implanting ions into the polysilicon layer. A material layer 317 is formed over the conductive layer 316. The material layer is a silicon nitride layer formed, for example, by performing a chemical vapor deposition. Obviously, silicon nitride is not the only material suitable for forming the material layer 317, other materials may be used as long as the material has an etching selectivity that differs from the conductive layer 316 and the cap layer 310. Thereafter, a patterned photoresist layer 318 is formed over the material layer 317. The patterned photoresist layer 318 is formed over designated area for forming the source region. Using the patterned photoresist layer 318 as a mask, the conductive layer 316 and the material layer 317 that are not covered by the patterned photoresist layer are removed, for example, by performing a wet etching or a dry etching process.

Figure 3B:
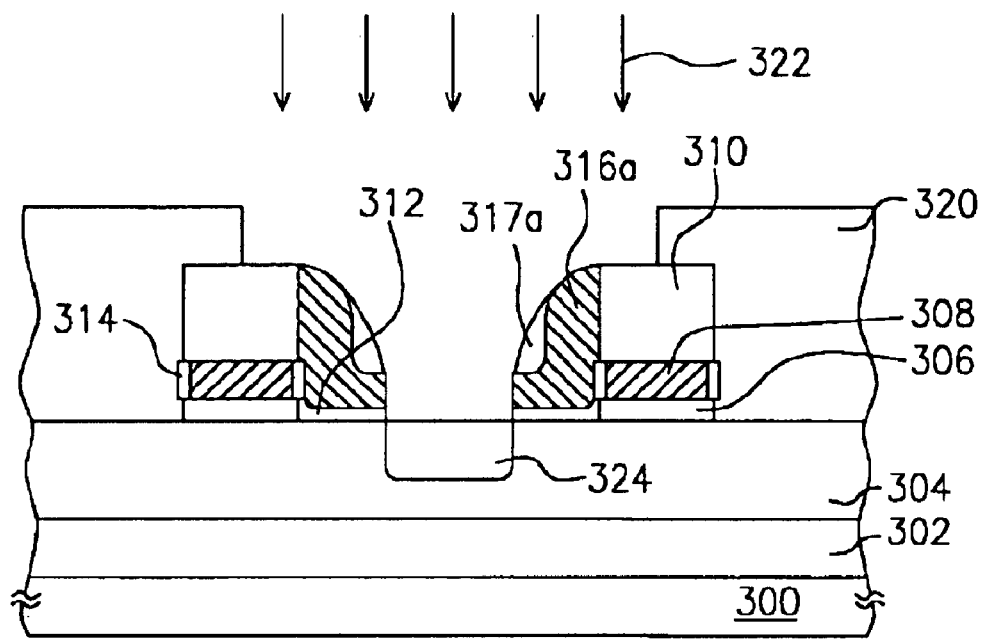

As shown in FIG. 3B, the patterned photoresist layer 318 is removed. Thereafter, an anisotropic etching process is performed to form conductive layers 316a (spacers) and spacers 317a on one of the sidewalls of the cap layer 310 and the conductive layer 308. The conductive layer 316a has an L-shaped profile and serves as a floating gate in the flash memory. Another patterned photoresist layer 320 is formed over the substrate 300. The patterned photoresist layer 320 exposes designated area for forming the source region. Using the patterned photoresist layer 320 as a mask, an implantation 322 is carried out implanting dopants into the P-well region 304 between the two neighboring conductive layers 316a to form a source region 324. N-type dopants such as phosphorus ions or arsenic ions are used in the implantation 322.

Figure 3C:
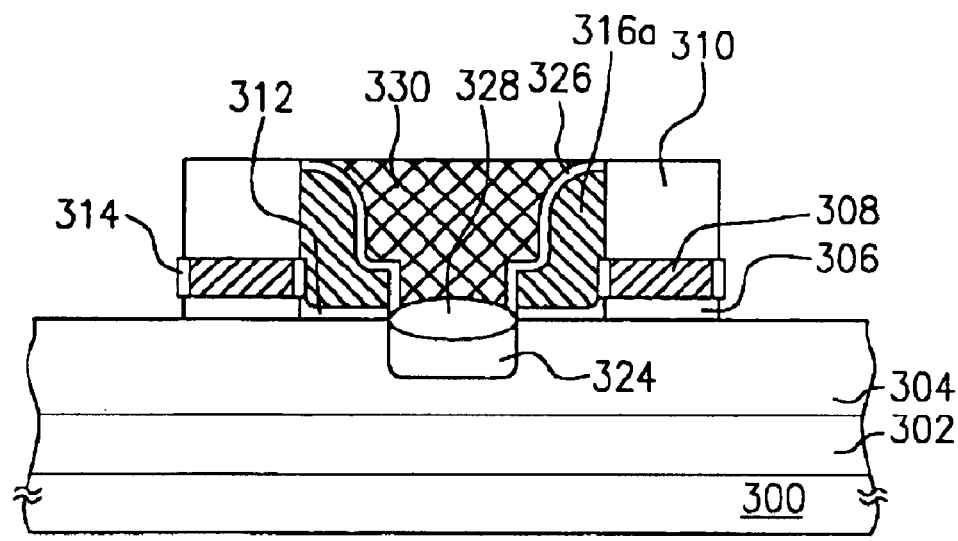

As shown in FIG. 3C, the patterned photoresist layer 320 is removed. Thereafter, the spacers 317a are removed, for example, by performing a wet etching or a dry etching process. An inter-gate dielectric layer 326 is formed over the conductive layer 316a and then an insulating layer 328 is formed over the source region 324. The inter-gate dielectric layer 326 can be a composite layer such as an oxide/nitride/oxide layer having thickness of 70 Å/70 Å/60 Å respectively. The inter-gate dielectric layer 326 is formed, for example, by performing a thermal oxidation to form a silicon oxide layer and then performing a chemical vapor deposition to form a silicon nitride layer and another silicon oxide layer sequentially over the first oxide layer. The insulating layer 328 is a silicon oxide layer formed, for example, by performing a thermal oxidation. The insulating layer 328 and the intergate dielectric layer 326 are formed in the same processing step.

Thereafter, another conductive layer 330 is formed over the substrate 300. The conductive layer 330 fills up the gap between the two neighboring conductive layer 316a. The conductive layer 330 can be a doped polysilicon layer formed, for example, by performing a chemical vapor deposition to form a doped polysilicon. Thereafter, a chemical-mechanical polishing or a back etching process is carried out to remove a portion of the doped polysilicon layer and expose the cap layer 310. A patterned photoresist layer (not shown) having a linear configuration is formed over the substrate 300 for patterning out the control gates of the flash memory. Using the patterned photoresist layer as a mask, the doped polysilicon layer that is not covered by the patterned photoresist layer is removed. After removing the patterned photoresist layer, the conductive layer 330 is formed. The conductive layer 330 serves as a control gate in the flash memory.

Figure 3D:
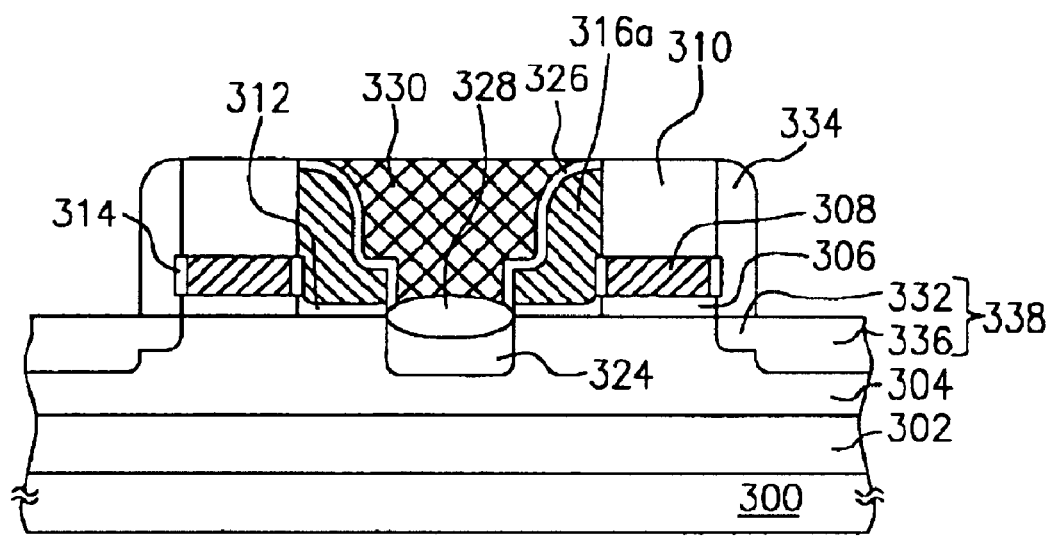

As shown in FIG. 3D, an ion implantation is carried out to form a lightly doped region 332 in the substrate 300 on one side (the side for forming the source terminal) of the conductive layer 308. Thereafter, spacers 334 are formed on the sidewalls of the cap layer 310, the conductive layer 308 and the dielectric layer 306. The spacers 334 are formed, for example, by depositing insulating material over the substrate 300 to form an insulating layer (not shown) and then performing an anisotropic etching process to remove a portion of the insulating layer. Thereafter, another ion implantation is carried out to form a heavily doped region 336 in the substrate 300 on one side (the side for forming the drain terminal) of the spacers 334. The lightly doped region 334 and corresponding heavily doped region 336 constitute the drain region 338 of the flash memory. Finally, other steps necessary for completing flash memory fabrication are performed. Since conventional steps are used, detail description is omitted.

In the second embodiment of this invention, the floating gate (the conductive layer 316a) is formed in a self-aligned process and hence the channel of two neighboring memory cell has equal length. Since channel length of two neighboring memory cells using the same source region is identical, non-symmetrical memory cell programming is prevented and reliability of the memory is improved.

Furthermore, because the floating gate (the conductive layer 316a) has an L-shaped profile, overlapping area between the floating gate (the conductive layer 316a) and the control gate (the conductive layer 330) is increased. Since gate coupling ratio of the device increases with overlapping area, overall performance of the device will improve.

It will be apparent to those skilled in the art that various modifications and variations can be made to the structure of the present invention without departing from the scope or spirit of the invention. In view of the foregoing, It is intended that the present invention cover modifications and variations of this invention provided they fall within the scope of the following claims and their equivalents.

What is claimed:

1. A method of manufacturing a flash memory, comprising the steps of:
providing a substrate having a first gate structure and a second gate structure thereon, wherein the first gate structure and the second gate structure each has a dielectric layer, a first conductive layer and a cap layer;
forming a tunneling oxide layer over the substrate and then forming first spacers on the sidewalls of the first conductive layer;
forming a second conductive layer on one side close to an area designated for forming a source region of the sidewalls of the first gate structure and the second gate structure;
forming the source region in the substrate;
forming an inter-gate dielectric layer over the second conductive layer and then forming an insulating layer over the source region by performing a thermal oxidation;
forming a third conductive layer in the space between the first gate structure and the second gate structure; and
forming a drain region in the substrate.

2. The method of claim 1, wherein the first conductive layer serves as a select gate.

3. The method of claim 1, wherein the second conductive layer serves as a floating gate.

4. The method of claim 1, wherein the third conductive layer serves as a control gate.

5. The method of claim 1, wherein the inter-gate dielectric layer is a composite layer including an oxide/nitride/oxide layer.

6. The method of claim 1, wherein the step of forming the second conductive layer further includes the steps of:
forming a first conductive material layer over the substrate;
forming a first patterned photoresist layer over the first conductive material layer, wherein the first patterned photoresist layer covers the area for forming the source region;
removing the first conductive material layer which is not covered by the first patterned photoresist layer by using the patterned photoresist layer as a mask;
removing the first patterned photoresist layer; and
performing an anisotrophic etching process to remove the first conductive material layer so as to form the second conductive layer.

7. The method of claim 1, wherein the step of forming a third conductive layer further includes the steps of:
forming a second conductive material layer over the substrate;
forming a second patterned photoresist layer over the second conductive material layer, wherein the second patterned photoresist layer covers the area designated for forming the source region;
removing the second conductive material layer which is not covered by the second patterned photoresist layer by using the second patterned photoresist layer as a mask; and
removing the second patterned photoresist layer.

8. The method of claim 7, wherein the method further includes a step of forming second spacers on the sidewalls of the third conductive layer after the step of forming a third conductive layer between the first gate structure and the second gate structure.

9. The method of claim 1, wherein the step of forming a third conductive layer further includes the steps of:
forming a third conductive material layer over the substrate;
removing a portion of the third conductive material layer to expose the cap layer;

forming a third patterned photoresist layer over the substrate, wherein the third patterned photoresist layer covers area designated for forming the source region;

removing the third conductive material layer which is not covered by the third patterned photoresist layer by using the third patterned photoresist layer as a mask; and removing the third patterned photoresist layer.

10. The method of claim 1, wherein the step of forming a drain region in the substrate further includes the steps of:

forming a lightly doped region in the substrate;

forming third spacers on one side facing the area designated for forming the drain region of the sidewalls of the first gate structure and the second gate structure; and forming a heavily doped region in the substrate.

11. A method of manufacturing a flash memory, comprising the steps of:

providing a substrate having a first gate structure and a second gate structure thereon, wherein the first gate structure and the second gate structure each has a dielectric layer, a first conductive layer and a cap layer;

forming a tunneling oxide layer over the substrate and then forming first spacers on the sidewalls of the first conductive layer;

forming a second conductive material layer over the substrate;

forming a material layer over the second conductive material layer;

forming a first patterned photoresist layer over the material layer, wherein the first patterned photoresist layer covers the area designated for forming a source region;

removing the material layer and the second conductive material layer that are not covered by the first patterned photoresist layer by using the first patterned photoresist layer as a mask;

removing the first patterned photoresist layer;

performing an anisotropic etching process to remove a portion of the material layer and the second conductive material layer so as to form a second spacer and a second conductive layer;

removing a portion of the second spacer;

forming the source region in the substitute in the area between the first gate structure and the second gate structure;

forming an inter-gate dielectric layer over the second conductive layer and then forming an insulating layer over the source region;

forming a third conductive layer in the space between the first gate structure and the second gate structure; and forming a drain region in the substrate on the other side of the first gate structure and the second gate structure.

12. The method of claim 11, wherein the first conductive layer serves as a select gate.

13. The method of claim 11, wherein the second conductive layer serves as a floating gate.

14. The method of claim 11, wherein the third conductive layer serves as a control gate.

15. The method of claim 11, wherein the inter-gate dielectric layer is a composite layer including an oxide/nitride/oxide layer.

16. The method of claim 11, wherein the step of forming a third conductive layer further includes the steps of:

forming a second conductive material layer over the substrate;

forming a second patterned photoresist layer over the second conductive material layer, wherein the second patterned photoresist layer covers area designated for forming the source region;

removing the second conductive material layer which is not covered by the second patterned photoresist layer by using the second patterned photoresist layer as a mask; and removing the second patterned photoresist layer.

17. The method of claim 16, wherein the method further includes a step of forming third spacers on the sidewalls of the third conductive layer after the step of forming a third conductive layer between the first gate structure and the second gate structure.

18. The method of claim 11, wherein the step of forming a third conductive layer further includes the steps of:

forming a third conductive material layer over the substrate;

removing a portion of the third conductive material layer to expose the cap layer;

forming a third patterned photoresist layer over the substrate, wherein the third patterned photoresist layer covers area designated for forming the source region;

removing the third conductive material layer which is not covered by the third patterned photoresist layer by using the third patterned photoresist layer as a mask; and removing the third patterned photoresist layer.

19. The method of claim 11, wherein the step of forming a drain region in the substrate further includes the sub-steps of:

forming a lightly doped region in the substrate;

forming fourth spacers on one side facing the area designated for forming the drain region of the sidewalls of the first gate structure and the second gate structure; and forming a heavily doped region in the substrate.

20. The method of claim 11, wherein the material layer has a different etching rate with the cap layer and the second conductive layer.

* * * * *